United States Patent
Nishimae et al.

(10) Patent No.: US 10,840,670 B2
(45) Date of Patent: Nov. 17, 2020

(54) LASER OSCILLATOR

(71) Applicant: Mitsubishi Electric Corporation, Tokyo (JP)

(72) Inventors: Junichi Nishimae, Tokyo (JP); Tomotaka Katsura, Tokyo (JP); Daiji Morita, Tokyo (JP); Hiroaki Kurokawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/336,473

(22) PCT Filed: Feb. 13, 2017

(86) PCT No.: PCT/JP2017/005191
§ 371 (c)(1),
(2) Date: Mar. 26, 2019

(87) PCT Pub. No.: WO2018/146819
PCT Pub. Date: Aug. 16, 2018

(65) Prior Publication Data
US 2019/0252844 A1 Aug. 15, 2019

(51) Int. Cl.
*H01S 3/08* (2006.01)
*H01S 3/082* (2006.01)
(Continued)

(52) U.S. Cl.
CPC ............ *H01S 3/08009* (2013.01); *H01S 3/07* (2013.01); *H01S 3/08004* (2013.01);
(Continued)

(58) Field of Classification Search
CPC ...... H01S 3/08009; H01S 3/0826; H01S 3/07; H01S 3/08004; H01S 3/08086;
(Continued)

(56) References Cited

U.S. PATENT DOCUMENTS 5,177,750 A 1/1993 Zorabedian
5,325,378 A 6/1994 Zorabedian
(Continued)

FOREIGN PATENT DOCUMENTS

CN 105811245 A 7/2016
CN 106338836 A 1/2017
(Continued)

OTHER PUBLICATIONS

International Search Report dated Apr. 25, 2017 for PCT/JP2017/005191 filed on Feb. 13, 2017, 8 pages including English Translation.

(Continued)

*Primary Examiner* — Xinning(Tom) Niu
(74) *Attorney, Agent, or Firm* — Xsensus LLP

(57) ABSTRACT

A laser oscillator includes: an external resonator configured to include laser media to emit laser beams having different wavelengths; and a partially reflective mirror to transmit part of the laser beams and reflect and return a remainder toward the laser media. The external resonator includes therein: a diffraction grating to perform wavelength coupling on the laser beams having different wavelengths emitted from the laser media so as to superimpose the laser beams into one laser beam and to emit, to the partially reflective mirror, the one laser beam; and a prism that is placed between the laser media and the diffraction grating and that superimposes the laser beams into one laser beam on the diffraction grating, the prism including two surfaces forming an apex angle, one of the two surfaces being an incident surface and another of the two surfaces being an exit surface.

9 Claims, 3 Drawing Sheets

(51) Int. Cl.
*H01S 3/07* (2006.01)
*H01S 5/40* (2006.01)

(52) U.S. Cl.
CPC ........ *H01S 3/0826* (2013.01); *H01S 3/08086* (2013.01); *H01S 3/0809* (2013.01); *H01S 3/0823* (2013.01); *H01S 5/4062* (2013.01); *H01S 5/4068* (2013.01)

(58) Field of Classification Search
CPC .... H01S 3/0809; H01S 5/4062; H01S 3/0823; H01S 5/4068
See application file for complete search history.

(56) References Cited

U.S. PATENT DOCUMENTS

| | | | |
|---|---|---|---|
| 6,084,695 | A | 7/2000 | Martin et al. |
| 6,603,788 | B1 * | 8/2003 | Vogler .................... H01S 3/106 372/100 |
| 6,728,488 | B1 | 4/2004 | Peng et al. |
| 6,952,510 | B1 | 10/2005 | Karlsen et al. |
| 7,468,832 | B2 | 12/2008 | Rothenberg et al. |
| 8,559,107 | B2 | 10/2013 | Chann et al. |
| 8,824,049 | B2 | 9/2014 | Chann et al. |
| 2003/0231687 | A1 | 12/2003 | Wakabayashi et al. |
| 2006/0062261 | A1 * | 3/2006 | Farmiga .................. H01S 5/141 372/20 |
| 2006/0092993 | A1 | 5/2006 | Frankel |
| 2006/0092994 | A1 | 5/2006 | Frankel et al. |
| 2006/0092995 | A1 | 5/2006 | Frankel et al. |
| 2008/0291950 | A1 * | 11/2008 | McCallion ......... G02B 26/0883 372/20 |
| 2011/0216792 | A1 * | 9/2011 | Chann .................. G02B 19/009 372/31 |
| 2012/0012762 | A1 | 1/2012 | Nowak et al. |
| 2016/0161752 | A1 | 6/2016 | Negoita et al. |

FOREIGN PATENT DOCUMENTS

| | | |
|---|---|---|
| JP | 05-198881 A | 8/1993 |
| JP | 06-138322 A | 5/1994 |
| JP | 2003-347627 A | 12/2003 |
| JP | 2008-071798 A | 3/2008 |
| JP | 2011-205061 A | 10/2011 |
| JP | 2013-521666 A | 6/2013 |
| JP | 2016-054295 A | 4/2016 |
| JP | 6227212 B1 | 11/2017 |
| WO | 2008/045653 A2 | 4/2008 |
| WO | 2017/127526 A1 | 7/2017 |
| WO | 2018/158892 A1 | 9/2018 |

OTHER PUBLICATIONS

Decision to grant a patent received for Japanese patent application No. 2017-540671, dated Sep. 5, 2017, 4 pages including English translation.
Office Action issued in Chinese Application 201780074525.1 dated Dec. 31, 2019.
German Office Action dated Feb. 17, 2020, issued in corresponding German Patent Application No. 112017005416.8.
Office Action dated Jun. 8, 2020 in Chinese Patent Application No. 201780074525.1, 13 pages.
Office Action dated Sep. 9, 2020 Chinese Patent Application No. 201780074525.1, 16 pages.

* cited by examiner

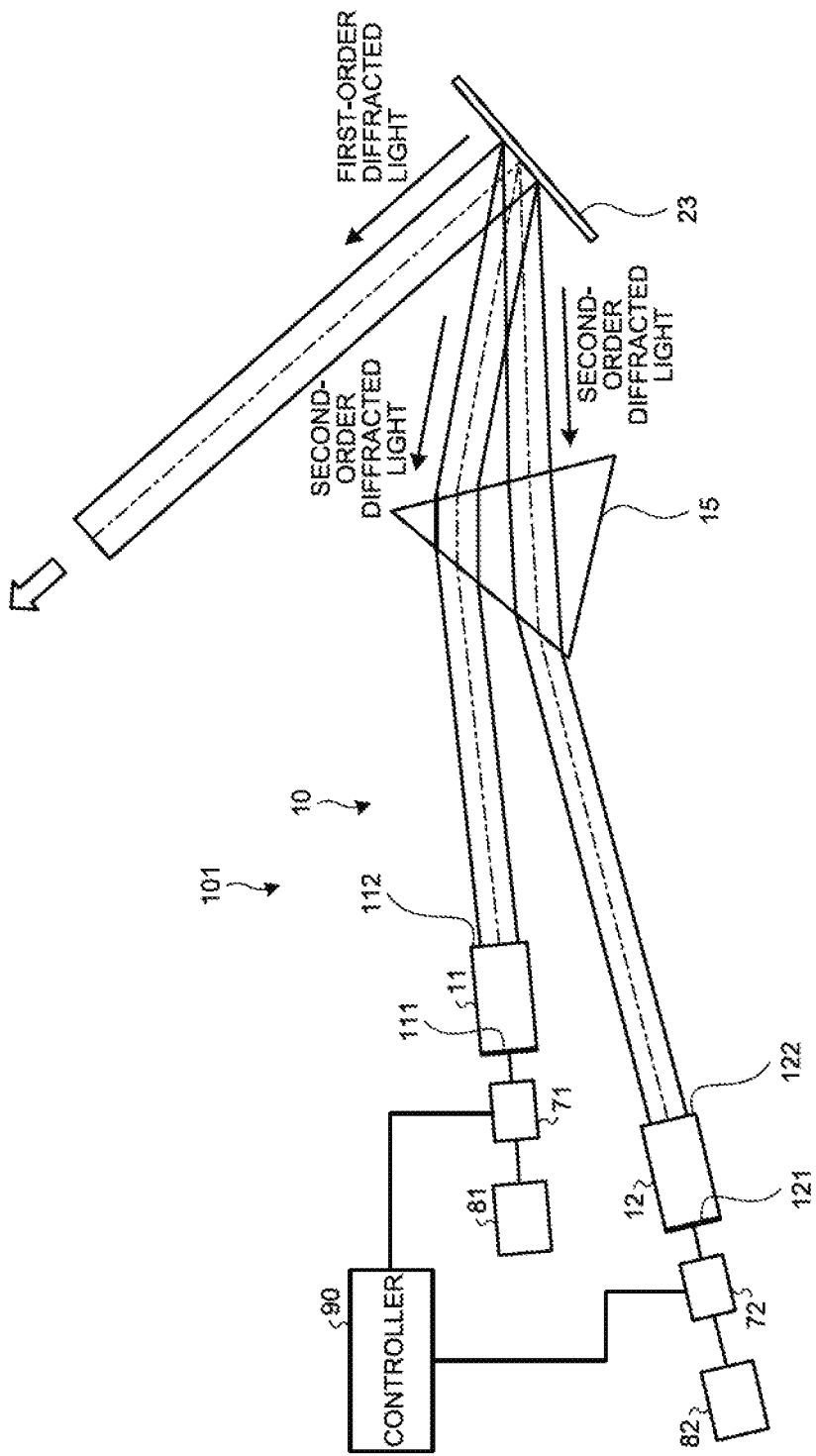

LASER OSCILLATOR

CROSS-REFERENCE TO RELATED APPLICATIONS

The present application is based on PCT filing PCT/JP2017/005191, filed Feb. 13, 2017, which is incorporated herein by reference.

FIELD

The present invention relates to a laser oscillator that performs wavelength coupling on a plurality of laser beams having different wavelengths that are emitted from a plurality of laser media and then outputs the laser beams.

BACKGROUND

To increase the intensity of laser beams, there have been attempts made to perform, by using wavelength dispersive elements, wavelength coupling on a plurality of laser beams having different wavelengths emitted from a plurality of laser media. Performing "wavelength coupling" in this specification means causing a plurality of laser beams having different wavelengths to exit at the same exit angle, i.e., a plurality of laser beams having different wavelengths are superimposed on each other to form one laser beam.

Patent literature 1 discloses a technology in which an external resonator that includes a plurality of laser media and a wavelength dispersive element sets the wavelengths of the laser beams emitted from the laser media to a unique value and another wavelength dispersive element installed outside the external resonator couples the laser beams emitted from the laser media.

CITATION LIST

Patent Literature

Patent Literature 1: Japanese translation of PCT international application No. 2013-521666

SUMMARY

Technical Problem

In the invention disclosed in Patent literature 1 described above, however, due to the action of the wavelength dispersive element, the beam diameters and the divergence angles of the laser beams that have passed through the wavelength dispersive element differ depending on the laser medium. Thus, a plurality of laser beams having different beam diameters and different divergence angles are resonated by the external resonator; therefore, there is a problem in that the light-harvesting of the laser beams output from the external resonator degrades and the output power of the external resonator is reduced.

The present invention has been achieved in view of the above and an object of the present invention is to provide a laser oscillator that has improved light-harvesting of the laser beams output from an external resonator.

Solution to Problem

In order to solve the above problems and achieve the object, an aspect of the present invention is a laser oscillator including: an external resonator configured to include a plurality of laser media to emit laser beams having different wavelengths; and a partially reflective element to transmit part of the laser beams and reflect and return a remainder toward the laser media. The external resonator includes therein: a wavelength dispersive element to perform wavelength coupling on the laser beams having different wavelengths emitted from the laser media so as to superimpose the laser beams into one laser beam and to emit, to the partially reflective element, the one laser beam; and a prism that is placed between the laser media and the wavelength dispersive element and that superimposes the laser beams into one laser beam on the wavelength dispersive element, the prism including two surfaces forming an apex angle, one of the two surfaces being an incident surface and another of the two surfaces being an exit surface.

Advantageous Effects of Invention

The laser oscillator according to the present invention has an effect in which light-harvesting of the laser beams output from an external resonator can be improved.

BRIEF DESCRIPTION OF DRAWINGS

FIG. 4 is a diagram illustrating the configuration of a laser oscillator according to a second embodiment of the present invention.

DESCRIPTION OF EMBODIMENTS

A laser oscillator according to embodiments of the present invention will be described in detail below with reference to the drawings. This invention is not limited to the embodiments.

First Embodiment

Figure 1:
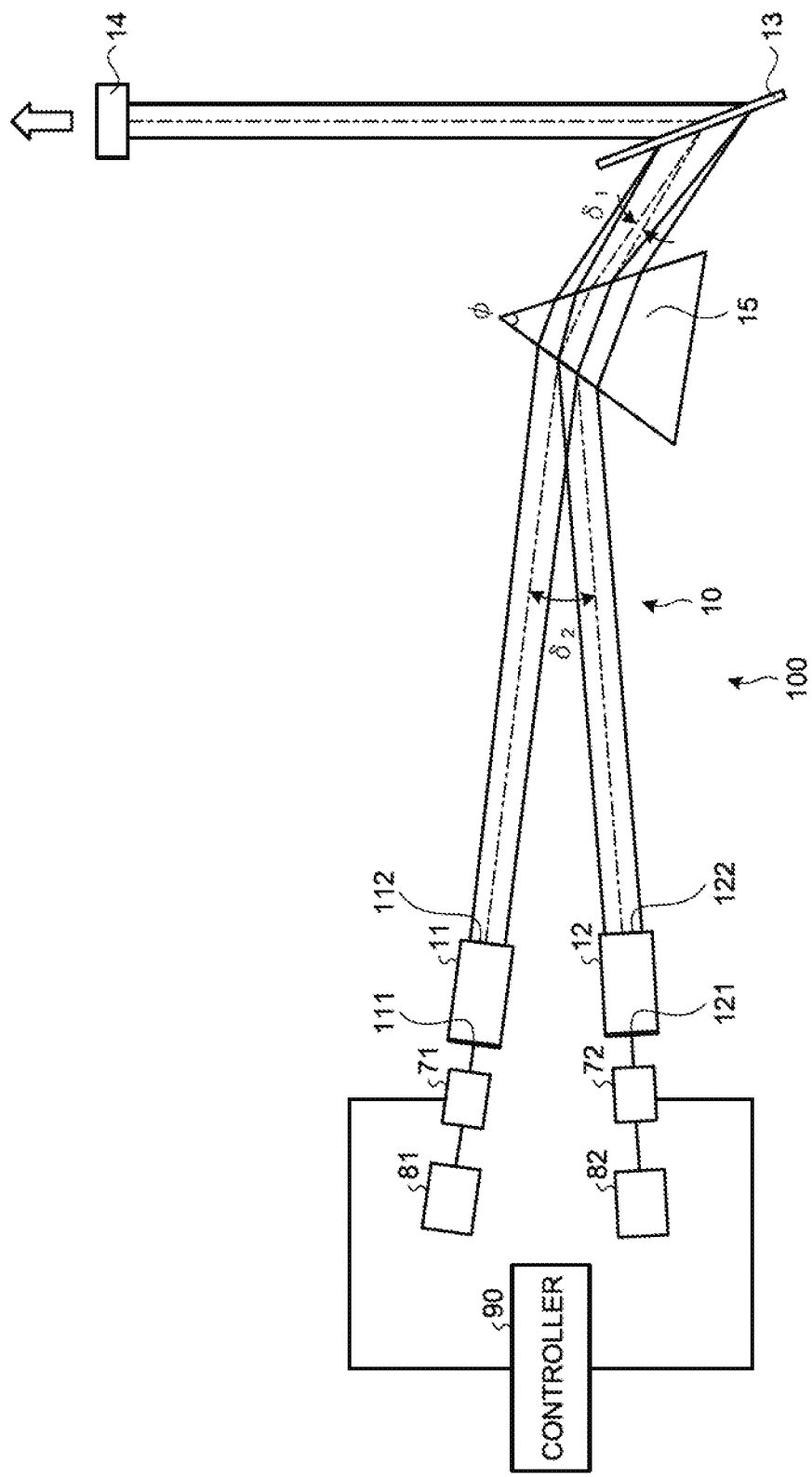
FIG. 1 is a schematic diagram illustrating the configuration of a laser oscillator according to a first embodiment of the present invention.

FIG. 1 is a schematic diagram illustrating the configuration of a laser oscillator according to a first embodiment of the present invention. A laser oscillator 100 according to the first embodiment includes a controller 90, drive circuits 71 and 72, drive power sources 81 and 82, and an external resonator 10. The external resonator 10 includes laser media 11 and 12, which emit laser beams having different wavelengths, and a partially reflective mirror 14, which is a partially reflective element that transmits part of the laser beam and reflects and returns the remainder toward the laser media 11 and 12. A diffraction grating 13 and a prism 15 are placed in the external resonator 10. The diffraction grating 13 performs wavelength coupling on the laser beams having different wavelengths emitted from the laser media 11 and 12 so that the laser beams are superimposed to form one laser beam, and it then emits this one laser beam toward the partially reflective mirror 14. The prism 15 is placed between the laser media 11 and 12 and the diffraction grating 13. The prism 15 superimposes the laser beams to form one laser beam on the diffraction grating 13. The diffraction grating 13 is a wavelength dispersive element that exhibits a wavelength dependency such that the relation between the incident angle and the exit angle of light changes depending on the wavelength. The prism 15 is placed such that its two surfaces, i.e., an incident surface and an exit surface, form an apex angle ϕ. The drive circuits 71 and 72 control turning on and off of the laser media 11 and 12 and have a protection function of interrupting the power supply to the laser media 11 and 12 when a short-circuit occurs. The drive power sources 81 and 82 are power sources that supply power to the drive circuits 71 and 72. The controller 90 controls the drive circuits 71 and 72 in accordance with the commands input from a numerical control device.

The laser media 11 and 12 are excited by light or electricity to generate laser light. Examples of the laser media 11 and 12 include an active layer of a semiconductor laser and a core of a fiber laser; however, the laser media 11 and 12 are not limited thereto. Reflective coatings 111 and 121, which are highly reflective and provided on the rear facets of the laser media 11 and 12, reflect majority of the light. Thus, the light generated by the laser media 11 and 12 is emitted forward from front facets 112 and 122.

The light generated by the laser media 11 and 12 reaches the diffraction grating 13 via the prism 15 so as to be superimposed into one laser beam on the diffraction grating 13. The relation between an incident angle α on the diffraction grating 13 and a diffraction angle β, which is the exit angle from the diffraction grating β, is represented by the following equation (1):

$$d(\sin \alpha + \sin \beta) = m\lambda \quad (1)$$

where d is the interval between the grooves in the diffraction grating 13, λ is the wavelength, and m is a natural number referred to as the order of diffraction.

As illustrated in FIG. 1, the laser beam from the laser medium 11 and the laser beam from the laser medium 12 are incident on the diffraction grating 13 at different incident angles and exit the diffraction grating 13 at the same diffraction angle. When the laser beam from the laser medium 11 and the laser beam from the laser medium 12 are incident on the diffraction grating 13, they form an angle 61.

The partially reflective mirror 14 reflects part of the laser beam diffracted by the diffraction grating 13, and it transmits the remainder to be output from the external resonator 10. The laser beam output from the external resonator 10 is used for various applications, for example, laser machining.

The laser beam reflected by the partially reflective mirror 14 retraces the optical path described above and returns to the laser media 11 and 12 via the diffraction grating 13 and the prism 15. The laser beams that have returned to the laser media 11 and 12 are amplified in the laser media 11 and 12; are reflected by the reflective coatings 111 and 121 on the rear side of the laser media 11 and 12; and are then reemitted from the laser media 11 and 12.

In the case where the external resonator 10 is functioning, the optical path is determined for each of the laser media 11 and 12 by the positional relation between the partially reflective mirror 14, the diffraction grating 13, the prism 15, and the laser media 11 and 12, and the laser beam from the laser medium 11 and the laser beam from the laser medium 12 are thus superimposed to form one laser beam on the diffraction grating 13. By determining the optical paths, the unique wavelength that satisfies equation (1) described above can also be determined. The laser oscillator 100 according to the first embodiment superimposes the laser beams from the laser media 11 and 12, which have different wavelengths, to form one laser beam. Therefore, the laser oscillator 100 according to the first embodiment can increase the intensity of the laser beam.

Next, a description will be given of the function of the prism 15. The prism 15 prevents the laser beams from the laser media 11 and 12 from having, after the wavelength coupling, different beam diameters and different divergence angles due to the beam diameter conversion effect of the diffraction grating 13 so as to improve the efficiency of the external resonator 10 and light-harvesting of the output beams.

Figure 2:
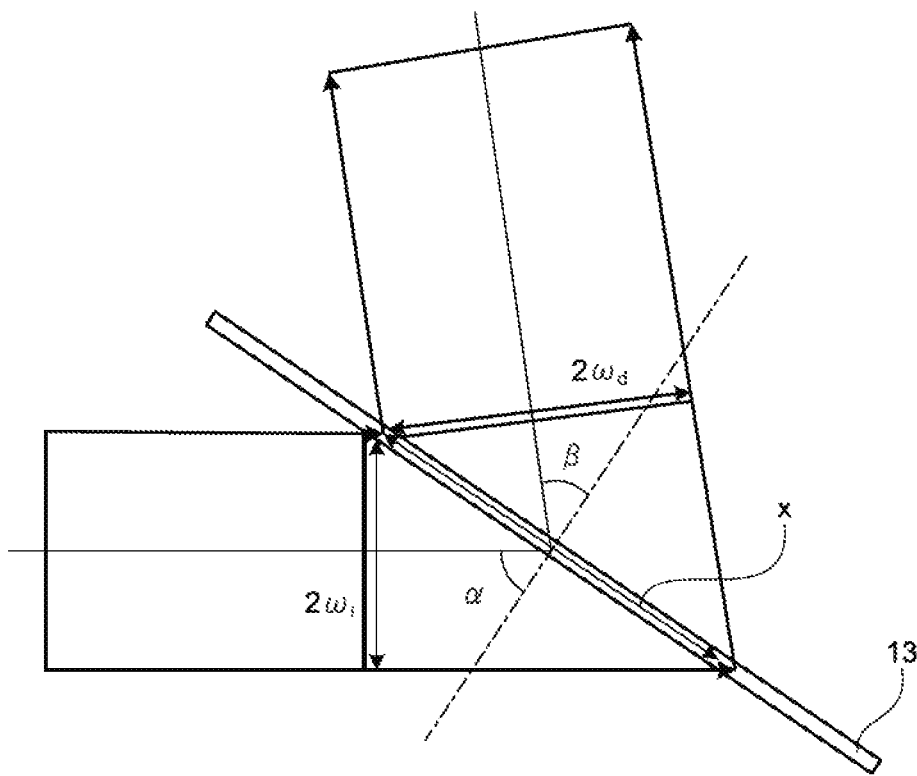
FIG. 2 is a diagram describing a beam diameter conversion effect in a diffraction grating in the laser oscillator according to the first embodiment.

FIG. 2 is a diagram describing the beam diameter conversion effect in the diffraction grating in the laser oscillator according to the first embodiment. In FIG. 2, the beam width x on the diffraction grating 13 is represented by x=2$\omega_i$/cos α=2$\omega_d$/cos β, where 2$\omega_i$ is the beam diameter of an incident beam and 2$\omega_d$ is the beam diameter of a diffraction beam. Thus, the following equation (2) holds between the beam diameter 2$\omega_i$ of the incident beam and the beam diameter 2$\omega_d$ of the diffraction beam:

$$\omega_d = (\cos \beta / \cos \alpha) \omega_i \quad (2)$$

This means that the beam diameter of the laser beam that has passed through the diffraction grating 13 is (cos β/cos α) times larger than it was before passing through the diffraction grating 13. To put it differently, if the incident angle α or the diffraction angle is different, the beam diameter of the laser beam that has passed through the diffraction grating 13 changes. The relation between the laser beams before and after passing through the diffraction grating 13 is that the product of the beam diameter and the divergence angle is the same; therefore, the beam divergence angle becomes (cos α/cos β) times. Thus, the ray matrix of the diffraction grating 13 is represented by the following equation (3). The Letters "A", "B", "C", and "D" in equation (3) indicate components of the ray matrix.

[Mathematical Formula 1]

$$\begin{pmatrix} A & B \\ C & D \end{pmatrix} = \begin{pmatrix} \dfrac{\cos \beta}{\cos \alpha} & 0 \\ 0 & \dfrac{\cos \alpha}{\cos \beta} \end{pmatrix} \quad (3)$$

The prism 15 also has a beam diameter conversion effect. In the laser oscillator 100 according to the first embodiment, the beam diameter conversion effect of the prism 15 reduces the effect of the beam diameter conversion effect of the diffraction grating 13.

Figure 3:
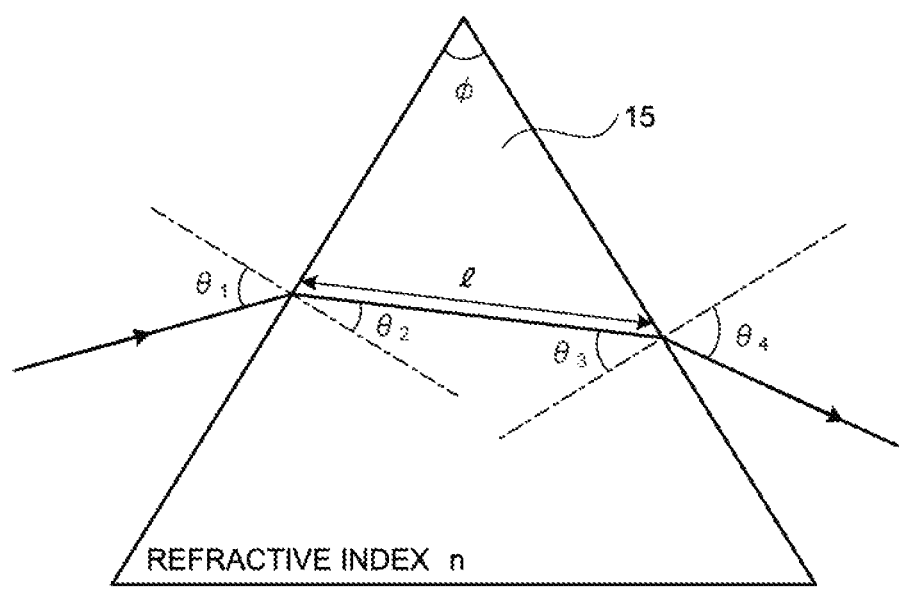
FIG. 3 is a diagram describing the function of a prism in the laser oscillator according to the first embodiment.

FIG. 3 is a diagram describing the function of the prism of the laser oscillator according to the first embodiment. The refractive index of the prism 15 is strictly wavelength dependent; however, if the wavelength range of the laser beams emitted from the laser media 11 and 12 is narrow, the wavelength dependency has a small effect on the refractive index. Thus, there is no problem in assuming the refractive index is a constant value. For example, synthetic quartz has a refractive index of n=1.45115 at a wavelength of 950 nm and n=1.45047 at a wavelength of 1000 nm. The difference between the refractive indices at a wavelength of 950 nm and at a wavelength of 1000 nm is 0.04%; therefore, if the wavelengths of the laser beams used are 950 nm and 1000 nm, there is no problem in assuming the refractive index of the prism 15 is a constant value.

As illustrated in FIG. 3, when the length of the optical path in the prism 15 is "1", the ray matrix of the prism 15 is represented by the following equation (4):

[Mathematical Formula 2]

$$\begin{pmatrix} A & B \\ C & D \end{pmatrix} = \begin{pmatrix} \frac{\cos\theta_4}{\cos\theta_3} & 0 \\ 0 & \frac{\cos\theta_3}{\cos\theta_4} \end{pmatrix} \begin{pmatrix} 1 & \frac{\ell}{n} \\ 0 & 1 \end{pmatrix} \begin{pmatrix} \frac{\cos\theta_2}{\cos\theta_1} & 0 \\ 0 & \frac{\cos\theta_1}{\cos\theta_2} \end{pmatrix} \quad (4)$$

$$= \begin{pmatrix} \frac{\cos\theta_4}{\cos\theta_3}\frac{\cos\theta_2}{\cos\theta_1} & \frac{\ell}{n}\frac{\cos\theta_4}{\cos\theta_3}\frac{\cos\theta_1}{\cos\theta_2} \\ 0 & \frac{\cos\theta_3}{\cos\theta_4}\frac{\cos\theta_1}{\cos\theta_2} \end{pmatrix}$$

On the basis of Snell's law and the relation of the internal angles of a triangle, the following equations (5), (6), and (7) hold. The letter "n" in equation (6) indicates the refractive index of a material of the prism 15.

$$\sin\theta_1 = n\sin\theta_2 \quad (5)$$

$$n\sin\theta_3 = \sin\theta_4 \quad (6)$$

$$\theta_2 + \theta_3 = \phi \quad (7)$$

By using equations (1), (3), (4), (5), (6), and (7), the ray matrix from the laser media 11 and 12 to the prism 15, and the ray matrix of free propagation from the prism 15 to the diffraction grating 13, it is possible to obtain the ray matrix from the laser media 11 and 12 to the exit of the diffraction grating 13 for each of the laser media 11 and 12.

It is satisfactory if the parameters such as the apex angle $\phi$ of the prism 15 and the incident angle $\theta_1$ on the prism 15 are determined such that the difference between the ray matrix from the laser medium 11 to the exit of the diffraction grating 13 and the ray matrix from the laser medium 12 to the exit of the diffraction grating 13 is small. An optical element and a cylindrical lens, in addition to the prism 15, are in some cases placed between the laser media 11 and 12 and the diffraction grating 13 in order to collimate the laser beams. Placement of an optical element and a cylindrical lens for collimating laser beams can be optimized in a similar manner by using ray matrices of the optical element and the cylindrical lens.

The diffraction grating 13 and the prism 15 act under different principles; therefore, the relation between the incident angle and the exit angle, i.e., the angle dependency of the relation between the incident beam diameter and the exit beam diameter of the diffraction grating 13 does not completely match that of the prism 15. Thus, if the external resonator 10 uses three or more laser media, then the beam diameter conversion effect of the prism 15 may not be able to completely cancel the beam diameter conversion effect of the diffraction grating 13. If the beam diameter conversion effect of the diffraction grating 13 cannot be completely canceled by the beam diameter conversion effect of the prism 15, the distance between the laser medium and the prism 15 is adjusted for each laser medium. Consequently, the difference in beam diameter between the laser beams from the laser media can be reduced on the diffraction grating 13. Specifically, if there is a laser medium that emits a laser beam to be diffracted by the diffraction grating 13 and directed toward the partially reflective mirror 14 with a beam diameter larger than that of the laser beam from the other laser media, that laser medium is moved toward the prism 15, thereby reducing the beam diameter of the laser beam diffracted by the diffraction grating 13 and directed toward the partially reflective mirror 14, and this equalizes the beam diameters of the laser beams. In contrast, if there is a laser medium that emits a laser beam to be diffracted by the diffraction grating 13 and directed toward the partially reflective mirror 14 with a beam diameter smaller than that of the laser beam from the other laser media, that laser medium is moved away from the prism 15, thereby increasing the beam diameter of the laser beam diffracted by the diffraction grating 13 and directed toward the partially reflective mirror 14, and this equalizes the beam diameters of the laser beams.

Depending on the apex angle $\phi$ of the prism 15 and where the prism 15 is placed, the number of laser media that can be placed in the external resonator 10 can be increased without sacrificing the efficiency, the size of the apparatus, and the stability.

The angle formed by the laser beam from the laser medium 11 and the laser beam from the laser medium 12 when the prism 15 is not placed in the external resonator 10 is indicated by $\delta 1$ in FIG. 1. The angle formed by the laser beam from the laser medium 11 and the laser beam from the laser medium 12 when the prism 15 is placed is indicated by $\delta 2$ in FIG. 1. This means that, with the laser oscillator 100 according to the first embodiment, the prism 15 reduces the angle formed by the laser beams from the laser media 11 and 12 near the diffraction grating 13. As illustrated in FIG. 1, if $\delta 2 > \delta 1$ is satisfied, the number of laser media that can be placed in the external resonator 10 can be increased.

Because laser media have fixed actual dimensions, the number of laser media placed in the external resonator can be increased only by increasing the angle $\delta 1$ formed by the laser media at opposite ends when viewed from a diffraction grating or by increasing the distance between the laser media and the diffraction grating. The former method increases the wavelength region and the latter method increases the size of the external resonator. An increase in the wavelength region results in the use of a region in which the diffraction efficiency of the diffraction grating is reduced, thereby reducing the efficiency. Moreover, because the wavelength width of the gain of a laser medium is limited, an increase in the wavelength region becomes a factor in reducing the efficiency of the laser medium. An increase in size of the external resonator causes an increase in size of the laser oscillator, which results in a cost increase and a reduction in the stability of the external resonator.

In the laser oscillator 100 according to the first embodiment, when the prism 15 is placed such that the angle between the laser media 11 and 12 when viewed from the diffraction grating 13 is increased, the number of laser media that can be placed in the external resonator 10 can be increased. Consequently, the output of the laser oscillator 100 and the intensity of the laser beam can be improved.

If the absence of the prism 15 results in an increase of the angle between the laser media 11 and 12 and thus creation of dead space in the external resonator 10, the angles $\delta 1$ and $\delta 2$ are set such that $\delta 1 > \delta 2$ is satisfied. This enables a reduction in size of the external resonator 10. In other words, the external resonator 10 can be downsized by increasing the angle formed by the laser beams from the laser media 11 and 12 near the diffraction grating 13 by using the prism 15.

The above description is of a configuration in which the prism 15 is placed such that wavelength-coupled laser beams directed toward the partially reflective mirror 14 from the diffraction grating 13 can have the same beam diameter and the same divergence angle. If the difference in beam diameter and the difference in divergence angle after wavelength coupling are smaller than those in the case where a plurality of laser beams are directly incident on the diffraction grating 13, the laser beams do not necessarily need to have the same beam diameter and the same divergence angle.

Second Embodiment

FIG. 4 is a diagram illustrating the configuration of a laser oscillator according to a second embodiment of the present invention. A laser oscillator 101 according to the second embodiment includes the external resonator 10 having a different configuration from that in the first embodiment.

In the first embodiment, the partially reflective mirror 14 is arranged to receive the first-order diffracted light of the laser beam from the diffraction grating 13. In the second embodiment, the second-order diffracted light of the laser beam from a diffraction grating 23 is returned to the laser media 11 and 12. Specifically, in the laser oscillator 101 according to the second embodiment, the laser media 11 and 12 and the diffraction grating 23 constitute the external resonator 10. With this configuration, the first-order diffracted light is diffracted at a diffraction angle of 0°. In other words, the first-order diffracted light is emitted perpendicularly to the diffraction grating 23. The first-order diffracted light is used as an output beam from the laser oscillator 101. The laser oscillator 101 includes the laser media 11 and 12; however, because the first-order diffracted light is emitted perpendicularly to the diffraction grating 23, a plurality of laser beams from the laser media 11 and 12 can be superimposed to form one laser beam.

In the laser oscillator 101 according to the second embodiment as well, the prism 15 is placed such that the beam diameters of the laser beams from the laser media 11 and 12 after being diffracted by the diffraction grating 23 are the same. Consequently, the beam diameters of the laser beams after being diffracted by the diffraction grating 23 are the same. Therefore, the beam quality can be improved.

The laser oscillator 101 according to the second embodiment can, in addition to simplifying and downsizing the apparatus due to elimination of a partially reflective mirror, reduce the loss in the external resonator 10 and thus improve the laser oscillation efficiency.

The configurations presented in the embodiments above are examples of an aspect of the present invention, and they can be combined with other known technologies or can be partly omitted or modified without departing from the scope of the present invention.

REFERENCE SIGNS LIST 10 external resonator; 11, 12 laser medium; 13 diffraction grating; 14 partially reflective mirror; 15 prism; 71, 72 drive circuit; 81, 82 drive power source; 90 controller; 100 laser oscillator; 111, 121 reflective coating; 112, 122 front facet.

The invention claimed is:

1. A laser oscillator comprising:
an external resonator configured to include
a plurality of laser media to emit laser beams having different wavelengths in different directions; and
a partially reflective element to transmit part of the laser beams and reflect and return a remainder toward the laser media, wherein
the external resonator includes therein:
a wavelength dispersive element
to perform wavelength coupling on the laser beams having different wavelengths emitted from the laser media so as to superimpose the laser beams into one laser beam and
to emit, to the partially reflective element, the one laser beam; and
a prism that is placed between the laser media and the wavelength dispersive element and that superimposes the laser beams into one laser beam on the wavelength dispersive element, the prism including two surfaces forming an apex angle, one of the two surfaces being an incident surface and another of the two surfaces being an exit surface, and
the prism causes a difference in beam diameter and a difference in divergence angle between the laser beams after the wavelength coupling to be smaller than the differences when the laser beams are directly incident on the wavelength dispersive element.

2. The laser oscillator according to claim 1, wherein the prism reduces an angle formed by the laser beams from the laser media near the wavelength dispersive element.

3. The laser oscillator according to claim 1, wherein the prism increases an angle formed by the laser beams from the laser media near the wavelength dispersive element.

4. A laser oscillator comprising:
an external resonator configured to include
a plurality of laser media to emit laser beams having different wavelengths in different directions; and
a wavelength dispersive element
to reflect and return part of the laser beams incident from the laser media to the laser media and
to superimpose a remainder of the laser beams by performing wavelength coupling and emit the remainder, wherein
the external resonator includes therein:
a prism that is placed between the laser media and the wavelength dispersive element and that superimposes the laser beams into one laser beam on the wavelength dispersive element, the prism including two surfaces forming an apex angle, one of the two surfaces being an incident surface and another of the two surfaces being an exit surface, and
the prism causes a difference in beam diameter and a difference in divergence angle between the laser beams after the wavelength coupling to be smaller than the differences when the laser beams are directly incident on the wavelength dispersive element.

5. The laser oscillator according to claim 1, wherein the prism causes the laser beams after the wavelength coupling to have an identical beam diameter and an identical divergence angle.

6. The laser oscillator according to claim 1, wherein the apex angle of the prism and an incident angle of the laser beams on the prism are determined such that a difference between ray matrices from the respective laser media to an exit of the wavelength dispersive element is smaller.

7. The laser oscillator according to claim 4, wherein the prism causes the laser beams after the wavelength coupling to have an identical beam diameter and an identical divergence angle.

8. The laser oscillator according to claim 4, wherein the apex angle of the prism and an incident angle of the laser beams on the prism are determined such that a difference between ray matrices from the respective laser media to an exit of the wavelength dispersive element is smaller.

9. The laser oscillator according to claim 4, wherein the wavelength dispersive element emits the remainder of the laser beams perpendicularly to a surface of the wavelength dispersive element.

* * * * *